(12) United States Patent
    Kano

(10) Patent No.: US 12,658,852 B2
(45) Date of Patent: Jun. 16, 2026

(54) QUANTUM DEVICE, OSCILLATION FREQUENCY SETTING METHOD, AND RECORDING MEDIUM

(71) Applicant: NEC Corporation, Tokyo (JP)

(72) Inventor: Yuya Kano, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/768,266

(22) Filed: Jul. 10, 2024

(65) Prior Publication Data

US 2025/0023517 A1     Jan. 16, 2025

(30) Foreign Application Priority Data

Jul. 12, 2023    (JP) ................................. 2023-114783

(51) Int. Cl.
| | |
|---|---|
| *H03B 15/00* | (2006.01) |
| *G06N 10/40* | (2022.01) |
| *H10D 48/00* | (2025.01) |
| *H10N 59/00* | (2023.01) |
| *H10N 60/00* | (2023.01) |
| *H10N 60/01* | (2023.01) |

(52) U.S. Cl.
CPC ............. *H03B 15/00* (2013.01); *G06N 10/40* (2022.01); *H03B 15/003* (2013.01); *H10D 48/383* (2025.01); *H10N 59/00* (2023.02); *H10N 60/0912* (2023.02)

(58) Field of Classification Search
CPC . G06N 10/40; H01P 1/38; H01P 1/383; H01P 5/12; H03B 15/00; H03B 15/003; H04J 1/08; H04J 1/12; H10D 48/383; H10N 59/00; H10N 60/0912; H10N 69/00; H10N 69/12; H10N 69/805

See application file for complete search history.

(56) References Cited

U.S. PATENT DOCUMENTS

| | | | | |
|---|---|---|---|---|
| 4,688,004 A * | 8/1987 | Hirai | ........................ | H03L 7/24 |
| | | | | 331/49 |
| 6,603,956 B1 * | 8/2003 | Shin | ........................ | H01P 3/165 |
| | | | | 333/248 |
| 2020/0250565 A1 * | 8/2020 | Bronn | .................. | H05K 1/0216 |
| 2020/0320423 A1 * | 10/2020 | Kelly | .................... | G06N 10/40 |

FOREIGN PATENT DOCUMENTS

| | | |
|---|---|---|
| JP | 2019-535169 A | 12/2019 |
| WO | 2018/055472 A3 | 3/2018 |

* cited by examiner

*Primary Examiner* — Levi Gannon
(74) *Attorney, Agent, or Firm* — Sughrue Mion, PLLC

(57) ABSTRACT

A quantum device includes: oscillator groups; circulators; and a transmission path common to the circulators. Each of the oscillator groups includes one or more oscillators having frequency variability. The one or more oscillators are connected to one port of one circulator of the circulators. The one circulator is common to the one or more oscillators. Each of the circulators is arranged on the transmission path. Each of the circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end.

11 Claims, 10 Drawing Sheets

QUANTUM DEVICE, OSCILLATION FREQUENCY SETTING METHOD, AND RECORDING MEDIUM

CROSS-REFERENCE TO RELATED APPLICATIONS

The present application claims priority to Japanese Patent Application No. 2023-114783, filed Jul. 12, 2023, the contents of which are incorporated herein by reference.

BACKGROUND

Technical Field

The present disclosure relates to a quantum device, an oscillation frequency setting method, and a recording medium.

Background Art

In quantum devices, signals may be transmitted in a multiplexed manner.

For example, Published Japanese Translation No. 2019-535169 of the PCT International Publication (hereinafter Patent Document 1) discloses a superconducting microwave coupler in which a plurality of band-pass filters (BPFs) are connected to a single transmission line. In this superconducting microwave coupler, each of the band-pass filters has a different narrow pass-band and transmits signals in a frequency division multiplexed manner.

SUMMARY

In the case of connecting multiple oscillators having frequency variability, such as Josephson parametric oscillators (JPOs), to a common transmission line, it is preferable to be able to reduce the influence of crosstalk between the oscillators and to utilize the frequency variability of the oscillators.

An example object of the present disclosure is to provide a quantum device, an oscillation frequency setting method, and a recording medium capable of solving the above problem.

Means for Solving the Problem

According to a first example aspect of the present disclosure, a quantum device includes: a plurality of oscillator groups; a plurality of circulators; and a transmission path common to the plurality of circulators. Each of the plurality of oscillator groups includes one or more oscillators having frequency variability. The one or more oscillators are connected to one port of one circulator of the plurality of circulators. The one circulator is common to the one or more oscillators. Each of the plurality of circulators is arranged on the transmission path. Each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end.

According to a second example aspect of the present disclosure, an oscillation frequency setting method is executed by a control device that controls a quantum device.

The quantum device includes: a plurality of oscillator groups; a plurality of circulators; and a transmission path common to the plurality of circulators. Each of the plurality of oscillator groups includes one or more oscillators having frequency variability. The one or more oscillators are connected to one port of one circulator of the plurality of circulators. The one circulator is common to the one or more oscillators. Each of the plurality of circulators is arranged on the transmission path. Each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end. At least one oscillator group of the oscillator groups includes a plurality of the oscillators including the one or more oscillators. The method includes: setting an oscillation frequency of each oscillator in a same oscillator group of the at least one oscillator group so that, for any combination of two oscillators included in the same oscillator group, a difference in oscillation frequency between the two oscillators is greater than or equal to a width of a range defined as a frequency range in which the oscillator is susceptible to influences.

According to a third example aspect of the present disclosure, an oscillation frequency setting method is executed by a control device that controls a quantum device. The quantum device includes: a plurality of oscillator groups; a plurality of circulators; and a transmission path common to the plurality of circulators. Each of the plurality of oscillator groups includes one or more oscillators having frequency variability. The one or more oscillators are connected to one port of one circulator of the plurality of circulators. The one circulator is common to the one or more oscillators. Each of the plurality of circulators is arranged on the transmission path. Each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end. The method includes: setting an oscillation frequency of each oscillator in different oscillator groups of the plurality of oscillator groups so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences.

According to the present disclosure, in the case of connecting oscillators having frequency variability are connected to a common transmission path, it is possible to enable a reduction in crosstalk between the oscillators while utilizing the frequency variability of the oscillators.

BRIEF DESCRIPTION OF THE DRAWINGS

FIG. 1 is a diagram showing a configuration example of a quantum device according to a first example embodiment.

FIG. 4 is a diagram showing a configuration example of a quantum device according to a second example embodiment.

FIG. 5 is a diagram showing a configuration example of a quantum device according to a third example embodiment.

FIG. 6 is a diagram showing a configuration example of a quantum device according to a fourth example embodiment.

EXAMPLE EMBODIMENT

Figure 2:
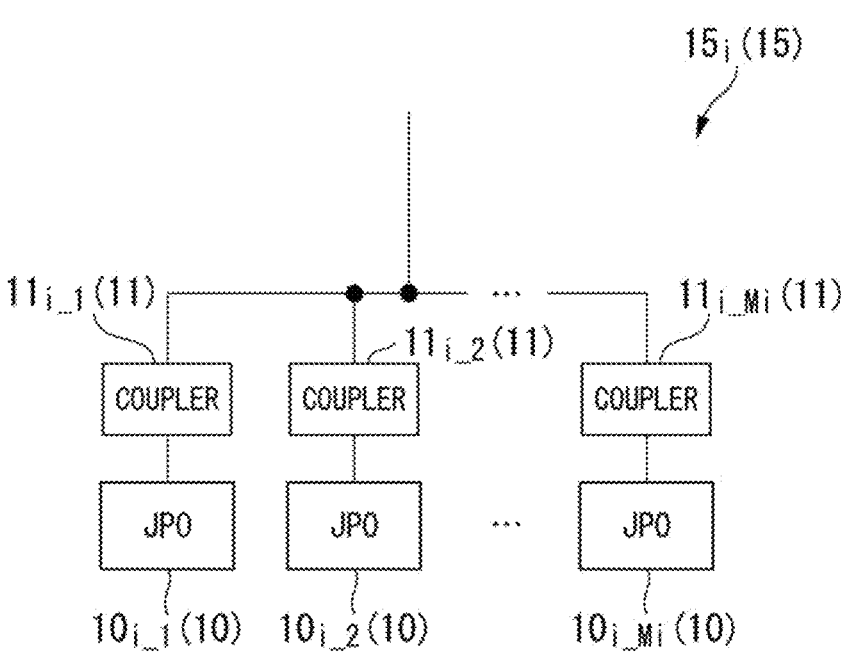
FIG. 2 is a diagram showing a configuration example of an oscillator group according to the first example embodiment.

Hereinafter, example embodiments of the present disclosure will be described, however, the present disclosure within the scope of the claims is not limited by the following example embodiments. Furthermore, not all the combinations of features described in the example embodiments are essential for the solving means of the disclosure.

First Example Embodiment

Figure 1:
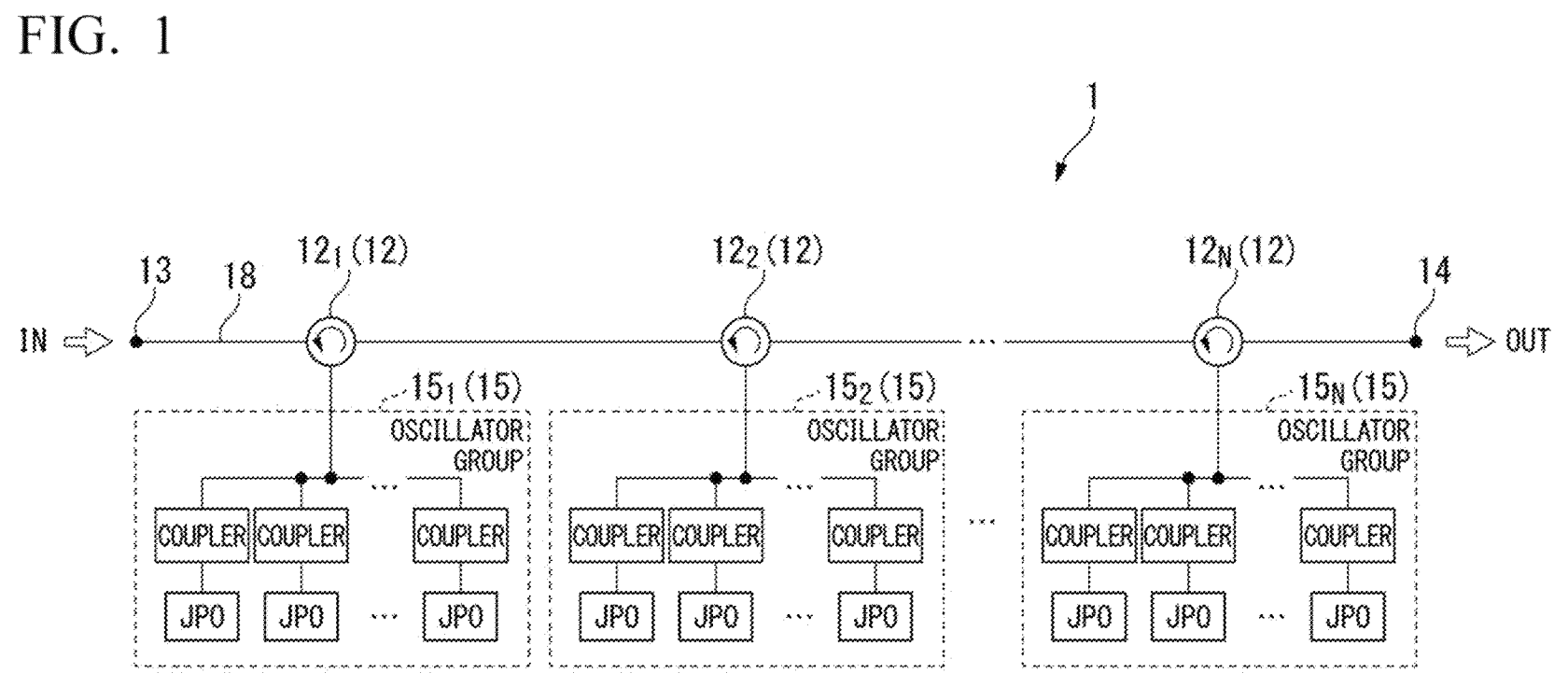

FIG. 1 is a diagram showing a configuration example of a quantum device according to a first example embodiment. In the configuration shown in FIG. 1, a quantum device 1 includes N oscillator groups 15, N circulators 12, and one transmission path 18. Here, N is an integer where $n \leq 2$.

In the case where the N oscillator groups 15 need to be distinguished from one another, they are also referred to as oscillator group $15_1$, oscillator group $15_2$, . . . , oscillator group $15_N$. In the case where the N circulators 12 need to be distinguished from one another, they are also referred to as circulator $12_1$, circulator $12_2$, . . . , circulator $12_N$.

The oscillator groups 15 and the circulators 12 are arranged in a one-to-one correspondence, and the oscillator group $15_i$ is connected to the circulator $12_i$. Here, i is an integer where $1 \geq i \geq N$.

The two ends of the transmission path 18 are also referred to as an input port 13 and an output port 14.

The input port 13 can be used as a port for inputting a signal to the oscillator group 15. The input port 13 corresponds to an example of a first end.

The output port 14 can be used as a port for outputting a signal from the oscillator group 15. The output port 14 corresponds to an example of a second end.

FIG. 2 is a diagram showing a configuration example of the oscillator group 15. In the configuration shown in FIG. 2, the oscillator group $15_i$ includes $M_i$ Josephson parametric oscillators 10 and $M_i$ couplers 11. Here, $M_i$ is an integer where $M_i \leq 1$. Each oscillator group 15 may include a different number of Josephson parametric oscillators 10 or the same number of Josephson parametric oscillators 10.

In the case where the $M_i$ Josephson parametric oscillators 10 included in the oscillator group $15_i$ need to be distinguished from one another, they are also referred to as Josephson parametric oscillator $10_{i\_1}$, Josephson parametric oscillator $10_{i\_2}$, . . . , Josephson parametric oscillator $10_{i\_Mi}$. In the case where the $M_i$ couplers 11 included in the oscillator group $15_i$ need to be distinguished from one another, they are also referred to as coupler $11_{i\_1}$, coupler $11_{i\_2}$, . . . , coupler $11_{i\_Mi}$.

The Josephson parametric oscillators 10 and couplers 11 are arranged in a one-to-one correspondence, and a Josephson parametric oscillator $10_{i\_j}$ is connected to a coupler $11_{i\_j}$. Here, j is an integer where $1 \geq j \geq M_i$.

For any of the $M_i$ Josephson parametric oscillators 10 included in the oscillator group $15_i$, the signal paths of the Josephson parametric oscillators 10 are combined into one via the coupler 11 and connected to one port of a circulator $12_i$. The signal input to the Josephson parametric oscillator 10 and the signal output from the Josephson parametric oscillator 10 are both transmitted through these paths.

The input of a signal is also referred to as the incidence of a signal.

The Josephson parametric oscillator 10 continues to output a quantum signal while operating as a quantum bit in response to the input of a control signal called a pump signal. Moreover, by manipulating the frequency of the pump signal and manipulating the resonance frequency of the Josephson parametric oscillator 10 by applying a magnetic field, the frequency (oscillation frequency) of the quantum signal (oscillation signal) output by the Josephson parametric oscillator 10 can be changed. The ability to change the oscillation frequency is also referred to as frequency variability.

Also, since the Josephson parametric oscillator 10 is a resonator, in the case where the frequency of a signal incident on the Josephson parametric oscillator 10 is different from the oscillation frequency, the Josephson parametric oscillator 10 has the property of reflecting the incident signal theoretically without loss. Here, the frequency of the signal incident on the Josephson parametric oscillator 10 being different from the oscillation frequency means, specifically, that the difference between the frequency of the incident signal and the oscillation frequency is greater than the bandwidth of the Josephson parametric oscillator 10.

However, the oscillators included in the oscillator group 15 are not limited to Josephson parametric oscillators, and may be various oscillators having frequency variability.

The oscillators provided in the oscillator group 15 are also referred to as oscillators of the oscillator group 15 or oscillators included in the oscillator group 15.

The coupler 11 is a connection point between the Josephson parametric oscillators 10 and the circulator 12 side. The configuration of the coupler 11 is not limited to a specific configuration, and various configurations are possible as long as signals can be exchanged between the Josephson parametric oscillators 10 and the circulator 12 side. For example, the coupler 11 may be configured as a capacitive coupling (junction gap). Alternatively, the coupler 11 may be configured using a resonator. Alternatively, the coupler 11 may be configured as an inductive coupling (coupling by means of electromagnetic induction).

Figure 3:
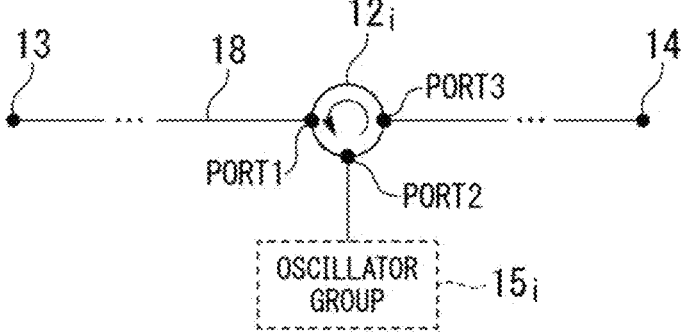
FIG. 3 is a diagram showing an example of a port arrangement of a circulator according to the first example embodiment.

FIG. 3 is a diagram showing an example of a port arrangement of the circulator 12 according to the first example embodiment.

The circulator 12 has three ports and transmits signals unidirectionally between the ports. The three ports of the circulator 12 are also referred to as port 1, port 2, and port 3. Here, it is assumed that a signal inputted from the port 1 of the circulator 12 is outputted to the port 2, and a signal inputted to the port 2 is outputted to the port 3. On the other hand, the circulator 12 blocks signals from the port 3 to the port 2 and from the port 2 to the port 1.

In general, circulators are theoretically lossless. Also, circulators can generally be broadband, for example several gigahertz (GHz) or greater.

The circulator 12 used may be a circulator having four or more ports. In such a case, the function of the circulator 12 may be realized by using three adjacent ports out of the four or more ports.

As shown in FIG. 3, the circulator 12 is arranged on the transmission path 18 such that the port 1 is located on the input port 13 side and the port 3 is located on the output port 14 side. Moreover, the port 2 is connected to the oscillator group 15.

Therefore, the circulator $12_i$ transmits a signal from the input port 13 side of the transmission path 18 to the oscillator group $15_i$ side, and transmits a signal from the oscillator group $15_i$ side to the output port 14 side of the transmission path 18. On the other hand, the circulator $12_i$ blocks signals from the output port 14 side to the oscillator group $15_i$ side and from the oscillator group $15_i$ side to the input port 13 side.

The input port 13 side is also referred to as the upstream side of the signal. The output port 14 side is also referred to as the downstream side of the signal.

In addition, the port 1 of the circulator $12_1$ is connected to the input port 13. The port 3 of the circulator $12_1$ through the circulator $12_{N-1}$ is connected to the port 1 of the circulator $12_2$ through the circulator $12_N$. The port 3 of the circulator $12_N$ is connected to the output port 14.

It should be noted that the port 1 of the circulator $12_1$ may be used as the input port 13. The port 3 of the circulator $12_N$ may be used as the output port 14. In the following description, it is assumed that the quantum device 1 transmits signals in a frequency division multiplexed manner. Accordingly, the oscillation frequencies of all the Josephson parametric oscillators 10 included in all the oscillator groups 15 are set to be different from one another.

However, two or more Josephson parametric oscillators 10 may have the same oscillation frequency.

For example, the quantum device 1 may transmit input and output signals to the Josephson parametric oscillator 10 by using both time division multiplexing and frequency division multiplexing. In such a case, the Josephson parametric oscillators 10 belonging to different groups in a time division multiplexing manner may have the same oscillation frequency.

The time division multiplexing in such a case can be realized, for example, by using a variable coupler as the coupler 11 and selecting the readout-target Josephson parametric oscillator 10 for each time period in the time division multiplexing. The variable coupler referred to here is a coupler the ON/OFF operation of which can be controlled.

Moreover, only some of the multiple Josephson parametric oscillators 10 included in the quantum device 1 may serve as targets for signal readout. In such a case, the Josephson parametric oscillators 10 that are not signal-readout targets may have the same oscillation frequency. For example, consider a case where the quantum device 1 includes four Josephson parametric oscillators 10. The four Josephson parametric oscillators 10 are designated as Josephson parametric oscillators 10A, 10B, 10C, and 10D, and their oscillation frequencies are designated as $f_A$, $f_B$, $f_C$, and $f_D$, respectively.

In the case where only the two Josephson parametric oscillators 10A, 10B of these four Josephson parametric oscillators 10 are the targets of signal readout, the oscillation frequencies of the Josephson parametric oscillators 10C, 10D may be the same. In other words, in the case where a signal with oscillation frequency $f_A$ and a signal with oscillation frequency $f_B$ are measurement targets, and a signal with oscillation frequency $f_C$ and a signal with oscillation frequency $f_D$ are ignored, $f_C$ may be equal to $f_D$.

Here, a computing device using superconducting quantum bits such as the quantum device 1 is placed in a dilution refrigerator, and it is required to minimize the number of input and output lines for transmitting signals between the interior and exterior of the dilution refrigerator.

In order to reduce the number of input and output lines between the interior and exterior of the dilution refrigerator, it is conceivable to transmit signals in a frequency division multiplexed manner. Frequency division multiplexing divides the frequency band available on a single transmission medium, such as a cable, into sub-bands, each of which carries a separate vibration.

For example, in the quantum device 1, signals are transmitted by frequency division multiplexing, so that input signals and output signals for all of the Josephson parametric oscillators 10 in all of the oscillator groups 15 are transmitted over a single transmission path 18. For the signal lines between the interior and exterior of the dilution refrigerator, it is sufficient to have an input line transmitting input signals to the input port 13 and an output line transmitting output signals from the output port 14.

A signal (input signal) inputted by frequency division multiplexing from the input port 13 is transmitted to all Josephson parametric oscillators 10 of the quantum device 1.

Here, a signal input to the port 1 of the circulator $12_k$ is input to the oscillator group $15_k$ from the port 2 of the circulator $12_k$. Here, k is an integer where 1≥k≥N−1.

In the case where the frequency of the signal input to the oscillator group $15_k$ is different from the oscillation frequency of any of the Josephson parametric oscillators 10 included in the oscillator group $15_k$, the signal is reflected theoretically losslessly and input to the port 2 of the circulator $12_k$. The signal input to the port 2 of the circulator $12_k$ is output from the port 3 of the circulator $12_k$ and input to the port 1 of the circulator $12_{k+1}$.

Thus, each frequency component of the frequency-division-multiplexed input signal from the input port 13 passes through the circulators 12 sequentially from the input port 13 side, such as circulator $12_1$, circulator $12_2$, . . . , and so on, and is input to the Josephson parametric oscillator 10 whose oscillation frequency matches that of the frequency component.

The role of the signal input to the Josephson parametric oscillator 10 (input signal from the input port 13) can be, for example, a test signal for measuring the reflection coefficient or transmission coefficient of the Josephson parametric oscillator 10, or a drive signal for controlling the Josephson parametric oscillator 10. However, the role of the signal input to the Josephson parametric oscillator 10 is not limited to these examples.

All oscillation signals of the Josephson parametric oscillators 10 are output from the output port 14.

The oscillation signal of the Josephson parametric oscillator 10 included in the oscillator group $15_i$ passes through the circulators 12 sequentially to the output port 14 side, such as circulator $12_i, \ldots$, circulator $12_N$, and is output from the port 3 of the circulator $12_N$ to the output port 14.

Here, the oscillation signal input to the port 1 of the circulator $12_k$ is also input to the oscillator group $15_k$ from the port 2 of the circulator $12_k$. Since the oscillation frequencies of all the Josephson parametric oscillators 10 are all different, the oscillation signals are reflected by the Josephson parametric oscillators 10 in the oscillator group $15_k$ and input to the port 2 of the circulator $12_k$. The oscillation signal input to the port 2 of the circulator $12_x$ is output from the port 3 of the circulator $12_k$ and input to the port 1 of the circulator $12_{k+1}$.

On the other hand, the oscillation signal of the Josephson parametric oscillator 10 included in the oscillator group $15_1$ is not input to the oscillator groups $15_1$ to $15_{l-1}$, that is, the oscillator groups 15 on the input port 13 side, because the circulator $12_1$ does not pass the signal from the port 2 to the port 1. Here, l is an integer where $2 \geq l \geq N$.

According to the quantum device 1, it is possible to reduce the influence of crosstalk between the Josephson parametric oscillators 10. The crosstalk between the Josephson parametric oscillators 10 referred to here is the oscillation signal of a Josephson parametric oscillator 10 being incident on another Josephson parametric oscillator.

Specifically, the oscillation signal of the Josephson parametric oscillator 10 in the oscillator group $15_{k+1}$ is prevented from being transmitted to the oscillator groups $15_1$ to $15_k$.

As a result, in the quantum device 1, it is possible to prevent or reduce a degradation of the readout fidelity of the Josephson parametric oscillators 10 in the oscillator group $15_k$, which is caused by the oscillation signals of the Josephson parametric oscillators 10 in the oscillator groups $15_{k+1}$ to $15_N$ being incident on the Josephson parametric oscillators 10 in the oscillator group $15_k$.

For example, as described above, by reducing the number of input signals from other Josephson parametric oscillators 10 to a Josephson parametric oscillator 10, it is expected that the degree of freedom in the operational parameter values for reducing the influence of the incident signals will be increased. This increases the degree of freedom in the combination of operational parameter values for the entire Josephson parametric oscillators 10, and it is thus expected that a more suitable combination of operational parameter values can be adopted to reduce the influence of the incident signals with higher precision.

As an indicator of readout fidelity of a Josephson parametric oscillator 10, the probability of correctly identifying the quantum bit state of the Josephson parametric oscillator 10 can be used based on the measurement of the oscillation signal of the Josephson parametric oscillator 10, however, the disclosure is not limited to this example.

Moreover, in the quantum device 1, the influence of crosstalk can be reduced without using an element that limits the pass-band, such as a band-pass filter, and in this respect, the frequency variability of the Josephson parametric oscillator 10 can be utilized.

For example, in the case of performing quantum annealing using the quantum device 1, the frequency variability of the Josephson parametric oscillator 10 is ensured, which widens the adjustment range in the case of adjusting the operational parameter values. This makes it possible to adjust the operational parameter values relatively easily, and it is thus expected that the operational parameter values can be appropriately set, enabling quantum annealing to be performed with relatively high precision.

Alternatively, it is possible to change the oscillation frequency during the control of the Josephson parametric oscillator 10. In such a case, it is sufficient that frequency multiplicity be obtained while measuring the oscillation signal, and it is not necessary that frequency multiplicity be obtained before the measurement.

As described above, the quantum device 1 includes the plurality of oscillator groups 15, the plurality of circulators 12, and the transmission path 18 common to the plurality of circulators 12. Each of the plurality of oscillator groups 15 includes one or more Josephson parametric oscillators 10. One or more Josephson parametric oscillators 10 included in one oscillator group 15 are connected to one port (port 2) of one circulator 12 that is common to the one or more Josephson parametric oscillators 10. Each of the plurality of circulators 12 is arranged on the transmission path 18 so as to transmit a signal from the input port 13 side of the transmission path 18 to the oscillator group 15 side and transmit a signal from the oscillator group 15 side to the output port 14 side of the transmission path 18, but to block signals from the output port 14 side to the oscillator group 15 side and from the oscillator group 15 side to the input port 13 side.

According to the quantum device 1, it is possible to reduce the influence of crosstalk between the Josephson parametric oscillators 10, while utilizing the frequency variability of the oscillators.

Moreover, the frequency characteristics of all the Josephson parametric oscillators 10 included in all the oscillator groups 15 are different from one another.

According to the quantum device 1, the input and output signals of all the Josephson parametric oscillators 10 included in all the oscillator groups 15 can be transmitted by frequency division multiplexing.

Second Example Embodiment

Figure 4:
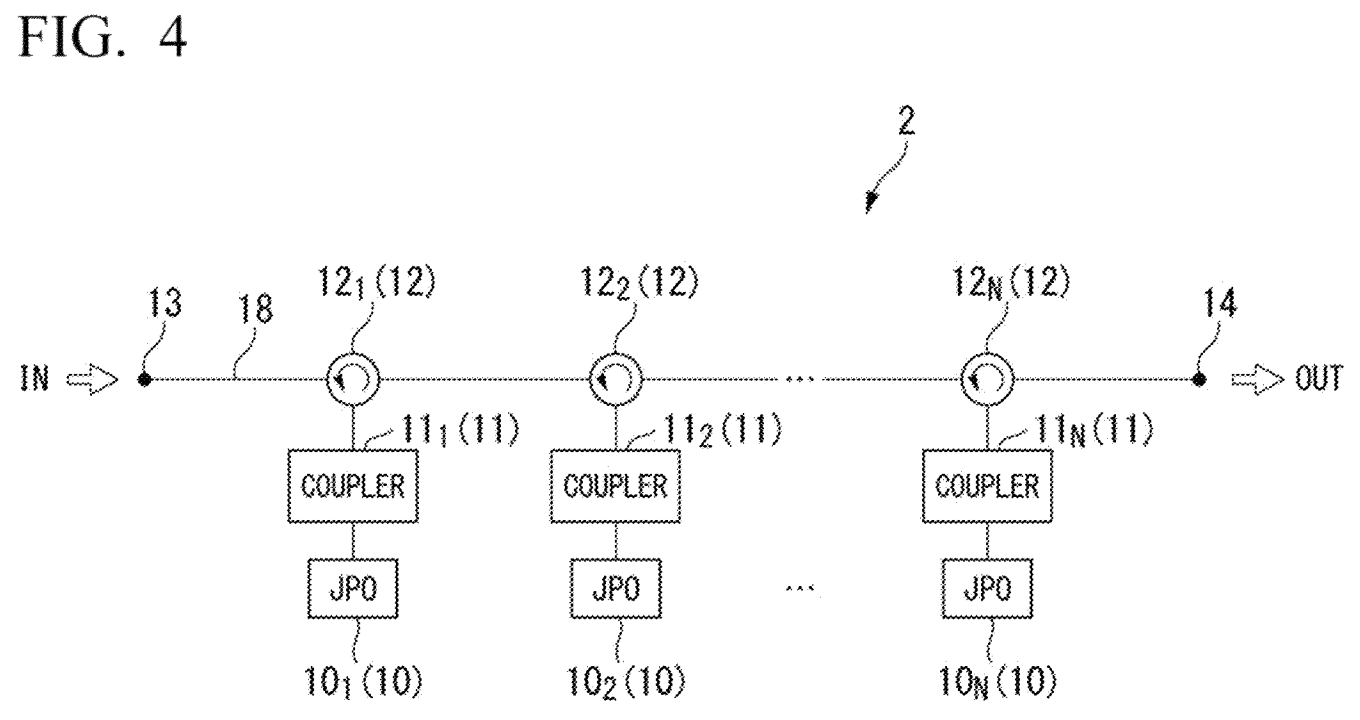

FIG. 4 is a diagram showing a configuration example of a quantum device according to a second example embodiment. In the configuration shown in FIG. 4, a quantum device 2 includes N Josephson parametric oscillators 10, N couplers 11, N circulators 12, and one transmission path 18. The ends of the transmission path 18 are used as an input port 13 and an output port 14.

Of the units shown in FIG. 4, ones corresponding to those in FIG. 1 or FIG. 2 and having the same functions are given the same reference symbols ($10$, $11$, $12$, $12_1$, $12_2, \ldots, 12_N$, $13$, $14$, and $18$), and descriptions thereof are omitted.

In the example of FIG. 4, the circulators 12 and couplers 11 are arranged in a one-to-one correspondence, and the circulator $12_i$ is connected to the coupler $11_i$. In other words, in the quantum device 2, only one pair of a coupler 11 and a Josephson parametric oscillator 10 is connected to one circulator 12.

In other respects, the quantum device 2 is the same as the quantum device 1. The quantum device 2 may be considered as having a configuration in which one oscillator group 15 in the quantum device 1 includes only one pair of coupler 11 and Josephson parametric oscillator 10.

In the configuration of FIG. 4, in the case where the N Josephson parametric oscillators 10 need to be distinguished from one another, they are also referred to as Josephson parametric oscillator $10_1$, Josephson parametric oscillator $10_2$, . . . , Josephson parametric oscillator $10_N$. In the case where the N couplers 11 need to be distinguished from one another, they are also referred to as coupler $11_1$, coupler $11_2$, . . . , coupler $11_N$.

As mentioned above, in the quantum device 2, one circulator 12 and one Josephson parametric oscillator 10 are connected.

As in the case of the quantum device 1, according to the quantum device 2, it is possible to reduce the influence of crosstalk between the Josephson parametric oscillators 10, while utilizing the frequency variability of the oscillators.

In the quantum device 2, compared to the quantum device 1, it is feasible to reduce the influence of crosstalk between the Josephson parametric oscillators 10 within the oscillator group 15 of the quantum device 1.

In this respect, the quantum device 2 is expected to be able to reduce the influence of crosstalk between Josephson parametric oscillators 10 even more than the quantum device 1.

On the other hand, regarding the quantum device 1, compared to the quantum device 2, fewer circulators 12 are needed for the number of Josephson parametric oscillators 10.

Third Example Embodiment

Figure 5:
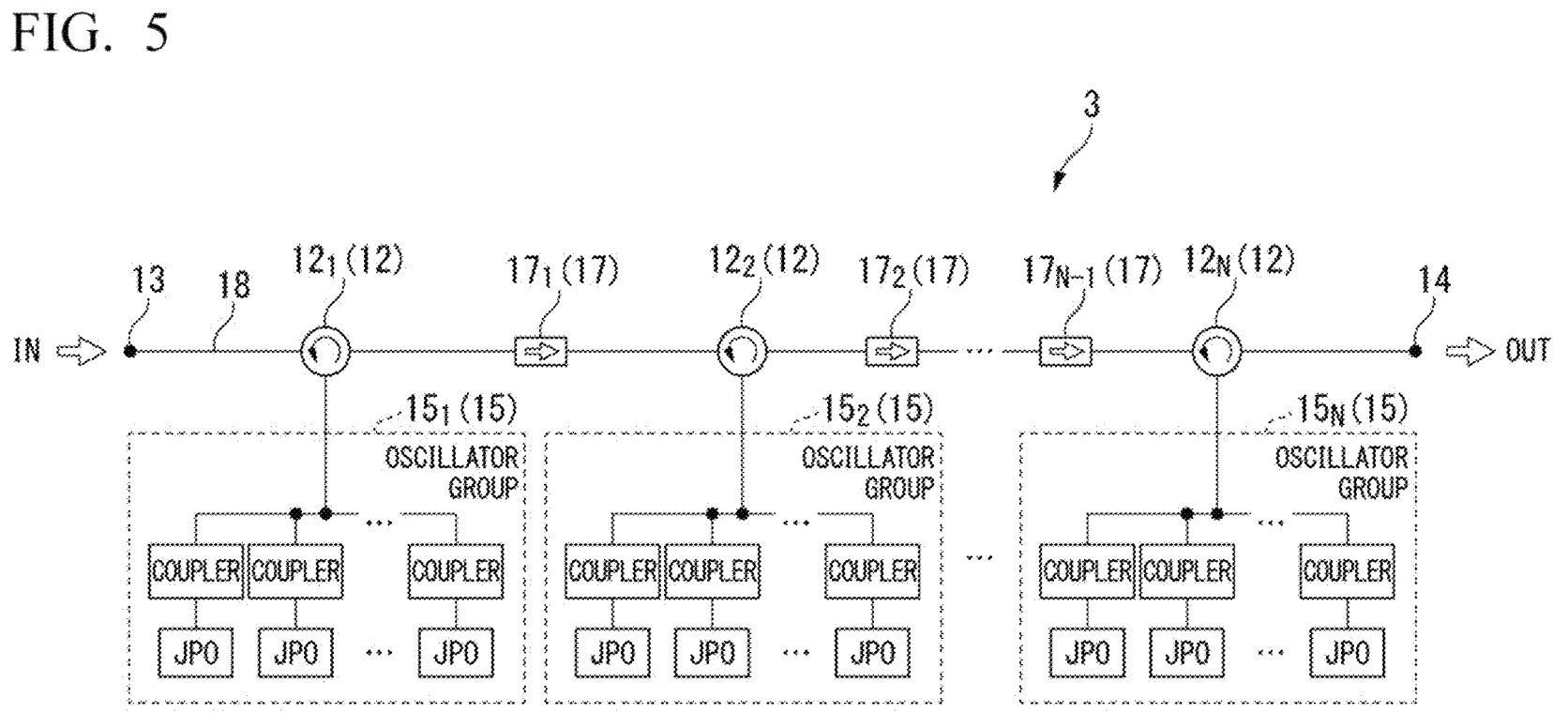

FIG. 5 is a diagram showing a configuration example of a quantum device according to a third example embodiment. In the configuration shown in FIG. 5, a quantum device 3 includes N oscillator groups 15, N circulators 12, N–1 isolators 17, and one transmission path 18. The ends of the transmission path 18 are used as an input port 13 and an output port 14.

Of the units shown in FIG. 5, ones corresponding to those in FIG. 1 and having the same functions are given the same reference symbols (12, $12_1$, $12_2$, . . . , $12_N$, 13, 14, 15, $15_1$, $15_2$, . . . , $15_N$, and 18), and descriptions thereof are omitted.

The quantum device 3 differs from the quantum device 1 in that, for each pair of circulators 12 adjacent to each other in the transmission path 18, one isolator 17 is provided between the pair of circulators 12. The port 3 of the circulator $12_k$ is connected to the port 1 of the circulator $12_{k+1}$ via the isolator $17_k$.

In other respects, the quantum device 3 is the same as the quantum device 1.

In the case where the N–1 isolators 17 need to be distinguished from one another, they are also referred to as isolator $17_1$, isolator $17_2$, . . . , isolator $17_{N-1}$.

The isolators 17 transmit signals in only one direction. In the quantum device 3, each isolator 17 is oriented so as to transmit a signal from the input port 13 side to the output port 14 side, but block signals from the output port 14 side to the input port 13 side.

It should be noted that, although FIG. 5 shows an example in which one isolator 17 is provided for each pair of adjacent circulators 12 in the transmission path 18, the isolators 17 may be provided only for some of the pairs of adjacent circulators 12 in the transmission path 18.

Thus, the isolator 17 is provided between at least a pair of adjacent circulators 12 in the transmission path 18, and transmits a signal from the input port 13 side to the output port 14 side, but blocks signals from the output port 14 side to the input port 13 side.

As in the case of the quantum device 1, according to the quantum device 3, it is possible to reduce the influence of crosstalk between the Josephson parametric oscillators 10, while utilizing the frequency variability of the oscillators.

Moreover, compared to the quantum device 1, in the quantum device 3, it is expected that the presence of isolators 17 will further reduce the influence of crosstalk between Josephson parametric oscillators 10.

Fourth Example Embodiment

Figure 6:
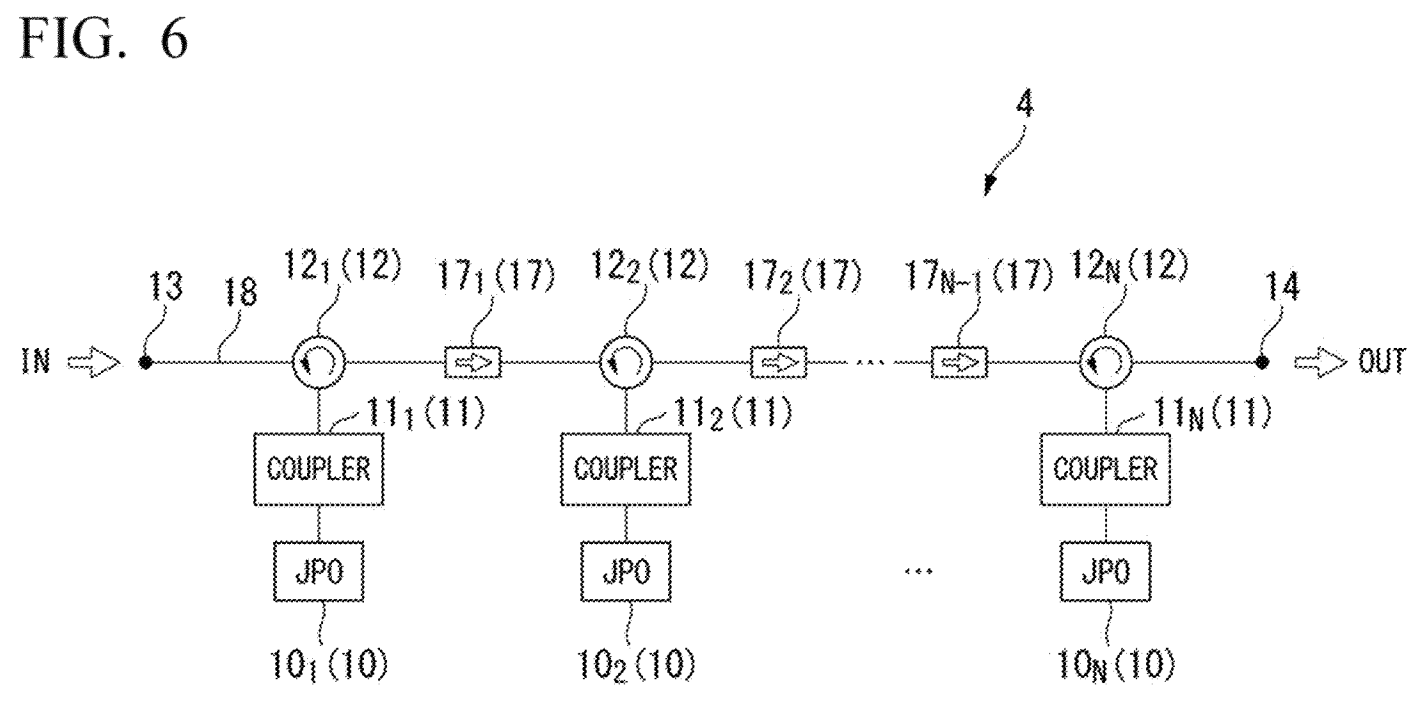

FIG. 6 is a diagram showing a configuration example of a quantum device according to a fourth example embodiment.

In the configuration shown in FIG. 6, a quantum device 4 includes N Josephson parametric oscillators 10, N couplers 11, N circulators 12, N–1 isolators 17, and one transmission path 18. The ends of the transmission path 18 are used as an input port 13 and an output port 14.

Of the units shown in FIG. 6, ones corresponding to those in FIG. 4 and having the same functions are given the same reference symbols (10, $10_1$, $10_2$, . . . , $10_N$, 11, $11_1$, $11_2$, . . . , $11_N$, 12, $12_1$, $12_2$, . . . , $12_N$, 13, 14, and 18), and descriptions thereof are omitted.

The quantum device 4 differs from the quantum device 2 in that, for each pair of circulators 12 adjacent to each other in the transmission path 18, one isolator 17 is provided between the pair of circulators 12. The port 3 of the circulator $12_k$ is connected to the port 1 of the circulator $12_{k+1}$ via the isolator $17_k$.

In other respects, the quantum device 4 is the same as the quantum device 2.

The isolator 17 is the same as that in the quantum device 3, and is given the same reference numeral (17) as in FIG. 5, and a detailed description thereof will be omitted here.

In the case where the N–1 isolators 17 need to be distinguished from one another, they are also referred to as isolator $17_1$, isolator $17_2$, . . . , isolator $17_{N-1}$.

It should be noted that, although FIG. 6 shows an example in which one isolator 17 is provided for each pair of adjacent circulators 12 in the transmission path 18, the isolators 17 may be provided only for some of the pairs of adjacent circulators 12 in the transmission path 18.

As mentioned above, in the quantum device 4, one circulator 12 and one Josephson parametric oscillator 10 are connected.

As in the case of the quantum device 2, according to the quantum device 4, it is possible to reduce the influence of crosstalk between the Josephson parametric oscillators 10, while utilizing the frequency variability of the oscillators.

Moreover, compared to the quantum device 2, in the quantum device 4, it is expected that the presence of isolators 17 will further reduce the influence of crosstalk between Josephson parametric oscillators 10.

Fifth Example Embodiment

It has been found that the magnitude of the influence of the incident signal on the Josephson parametric oscillator depends on the oscillation frequency of the Josephson parametric oscillator and the frequency of the incident signal.

Hence, adjusting the oscillation frequency of the Josephson parametric oscillators is anticipated to reduce the influence of crosstalk between the Josephson parametric oscillators in the case of employing frequency division multiplexing for transmitting input and output signals to multiple Josephson parametric oscillators.

In a fifth example embodiment, an example of adjusting the oscillation frequency of the Josephson parametric oscillator 10 in the first example embodiment will be described.

A quantum device in the fifth example embodiment is similar to that in the first example embodiment, except that the oscillation frequency of the Josephson parametric oscillator is set based on specific conditions. The fifth example embodiment will also be described with reference to FIG. 1 to FIG. 3.

The upper limit value $f_{inf\_max}$ of the frequency of an incident signal at which a Josephson parametric oscillator is susceptible to influences can be expressed as shown in Equation 1.

(Equation 1)

$$f_{inf\_max} = \frac{f_{pump}}{2} \quad (1)$$

$f_{pump}$ represents the frequency of the pump signal input to the Josephson parametric oscillator that receives the signal. $f_{pump}/2$ can be roughly equated to the oscillation frequency of the Josephson parametric oscillator.

The lower limit value $f_{inf\_min}$ of the frequency of an incident signal at which the Josephson parametric oscillator is susceptible to influences can be expressed as shown in Equation 2.

(Equation 2)

$$f_{inf\_min} = 2 \times K \times \alpha^2 \times c + \frac{f_{pump}}{2} \quad (2)$$

Here, × represents scalar multiplication.

K represents the Kerr coefficient. The Kerr coefficient K is a coefficient that represents the Kerr nonlinearity of a Josephson parametric oscillator, which is a nonlinear resonator, and is generally K<0.

α represents the coherent state amplitude. The coherent state amplitude α is an eigenvalue for the annihilation operator in the case where the quantum state of the Josephson parametric oscillator is regarded as a coherent state.

The coefficient c is a constant that takes a value from 1 to 4.

The range of frequencies of an incident signal, from the lower limit value $f_{inf\_min}$ to the upper limit value $f_{inf\_max}$, in which a Josephson parametric oscillator is susceptible to influences, is also referred to as a frequency range in which the Josephson parametric oscillator is susceptible to influences.

The frequencies of incident signals at which a Josephson parametric oscillator is susceptible to influences can be expressed as frequencies within the range of $2 \times K \times \alpha^2 c$ to 0, in relative values based on the oscillation frequency of the Josephson parametric oscillator. Here, $2 \times K \times \alpha^2 \times c < 0$.

$2 \times K \times \alpha^2 c$ generally ranges from −800 megahertz (MHz) to −20 megahertz, and is typically −100 megahertz. This is because the product $K\alpha^2$ of the Kerr coefficient K and the square of the coherent state amplitude α can be approximated by −1 times the intensity of the pump signal input to the Josephson parametric oscillator, and generally $K\alpha^2$ has a value of O (−10) megahertz.

In the quantum device 1, the influence of crosstalk between the Josephson parametric oscillators 10 can be further reduced by ensuring that the frequency of the oscillation signal of another Josephson parametric oscillator that is input to the Josephson parametric oscillator 10 is not included in the frequency range in which the Josephson parametric oscillator 10 receiving the input signal is susceptible to influences.

Accordingly, the oscillation frequency of the Josephson parametric oscillator 10 is set so as to satisfy the following conditions (1) and (2).

(1) For any combination of two Josephson parametric oscillators 10 included in the same oscillator group 15, the difference in oscillation frequency between the two Josephson parametric oscillators 10 is greater than or equal to $|2 \times K \times \alpha^2 \times c|$. That is to say, the difference in oscillation frequency between any Josephson parametric oscillator 10 in any oscillator group 15 and any other Josephson parametric oscillator 10 included in that oscillator group 15 is $|2 \times K \times \alpha^2 \times c|$ or more. Here, || represents the absolute value.

(2) For any combination of two Josephson parametric oscillators 10 included in different oscillator groups 15, among those two Josephson parametric oscillators 10, the oscillation frequency of the Josephson parametric oscillator 10 included in the oscillator group 15 on the input port 13 side is outside the range defined as the frequency range in which the Josephson parametric oscillator 10 included in the oscillator group 15 on the output port 14 side is susceptible to influences. That is to say, the oscillation frequencies of any of the Josephson parametric oscillators 10 included in the oscillator groups $15_1$ to $15_{l-1}$ are not included in the frequency range in which any of the Josephson parametric oscillators 10 included in the oscillator group $15_1$ are susceptible to influences. Here, as above, l is an integer where $2 \geq l \geq N$. N is an integer greater than or equal to 2 and indicates the number of oscillator groups 15.

Figure 7:
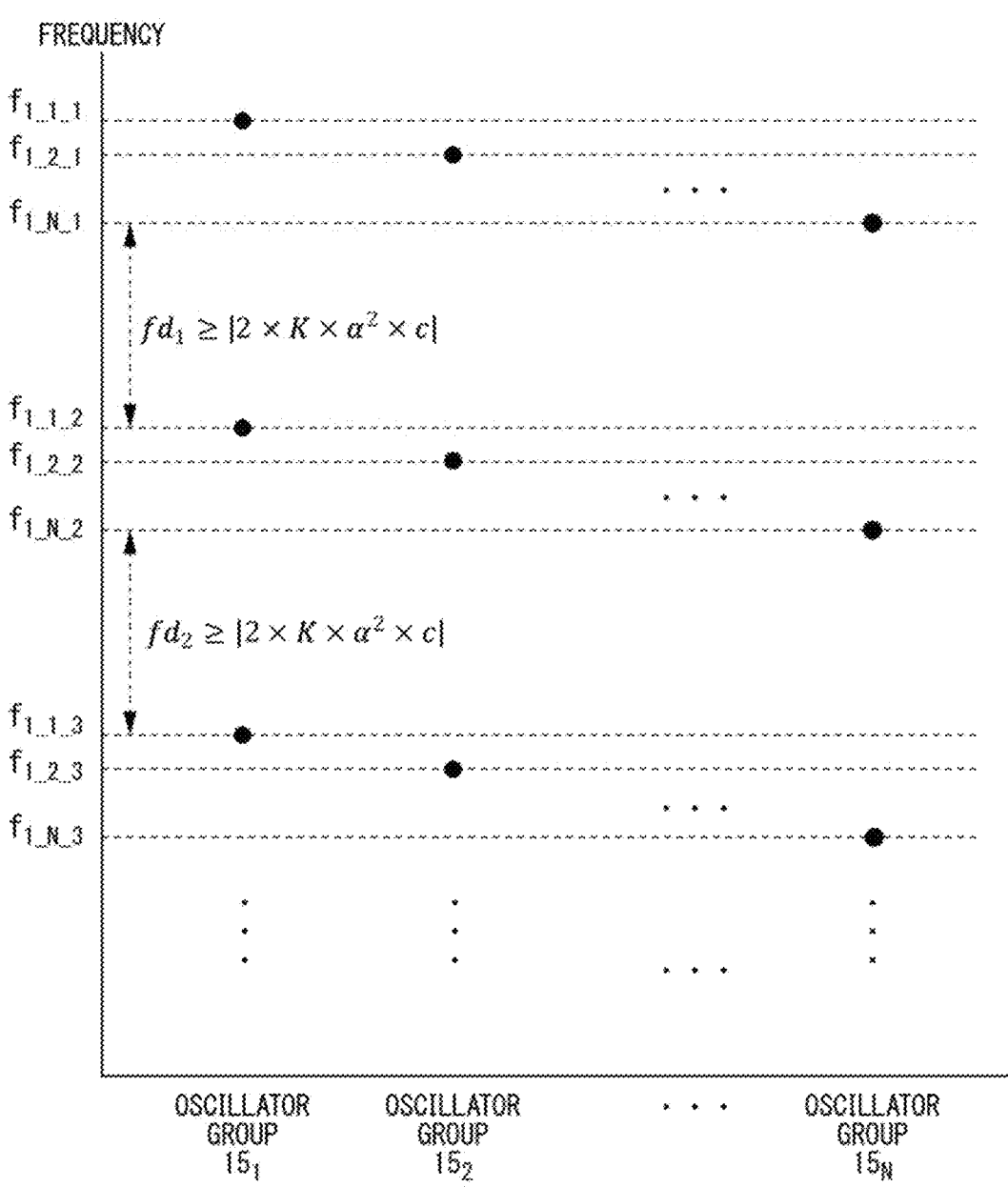
FIG. 7 is a diagram showing an example of oscillation frequencies of Josephson parametric oscillators in a quantum device according to a fifth example embodiment.

FIG. 7 is a diagram showing an example of oscillation frequencies of the Josephson parametric oscillator 10 in the quantum device 1. The vertical axis of the graph in FIG. 7 represents frequency, and the oscillator groups 15 are shown on the horizontal axis.

In FIG. 7, the oscillation frequency of the Josephson parametric oscillator $10_{i\_j}$ is denoted as $f_{1\_i\_j}$. As above, i is an integer where $1 \geq i \geq N$, and j is an integer where $1 \geq j \geq M_i$. $M_i$ is an integer where $M_i \leq 1$, and indicates the number of Josephson parametric oscillators 10 included in the oscillator group $15_i$.

In the example of FIG. 7, $f_{1\_1\_j} \leq f_{1\_2\_j} \leq \ldots \leq f_{1\_N\_j}$. Also, the difference $fd_j$ between $f_{1\_N\_j}$ and $f_{1\_1\_j+1}$ satisfies $fd_j \leq |2 \times K \times \alpha^2 \times c|$. The values of $fd_1$, $fd_2$, ..., $fd_{N-1}$ may be the same or different.

Thus, in the example of FIG. 7, the oscillation frequency of the Josephson parametric oscillator 10 included in the oscillator group 15 on the input port 13 side is either greater (higher) than the oscillation frequency of the Josephson parametric oscillator 10 on the output port 14 side, or less (lower) than the oscillation frequency of the Josephson parametric oscillator 10 on the output port 14 side by $|2 \times K \times \alpha^2 \times c|$ or more.

In the example of FIG. 7, the difference in oscillation frequency between the Josephson parametric oscillators 10 included in the same oscillator group 15 is $|2 \times K \times \alpha^2 \times c|$ or more, which satisfies the above condition (1).

The width of the range from $f_{inf\_min}$ to $f_{inf\_max}$, $|2\times K\times\alpha^2\times c|$, corresponds to an example of the width of the range defined as the frequency range in which the oscillator is susceptible to influences.

In the example of FIG. 7, the oscillation frequency of the Josephson parametric oscillator 10 included in the oscillator group 15 on the input port 13 side is outside the frequency range in which the Josephson parametric oscillator 10 included in the oscillator group 15 on the output port 14 side is susceptible to influences, which satisfies the above condition (2).

As mentioned above, at least one oscillator group 15 includes a plurality of Josephson parametric oscillators 10. For any combination of two Josephson parametric oscillators 10 included in the same oscillator group 15, the oscillation frequency of each Josephson parametric oscillator 10 is set, so that the difference in oscillation frequency between those two Josephson parametric oscillators 10 is greater than or equal to the range width $|2\times K\times\alpha^2\times c|$ defined as the frequency range in which the Josephson parametric oscillator 10 is susceptible to influences.

According to the quantum device 1, it is possible to reduce the influence of crosstalk between the Josephson parametric oscillators 10 included in the same oscillator group 15.

For any combination of two Josephson parametric oscillators 10 included in different oscillator groups 15, the oscillation frequency of each Josephson parametric oscillator 10 is set, so that, among those two Josephson parametric oscillators 10, the oscillation frequency of the Josephson parametric oscillator 10 included in the oscillator group 15 on the input port 13 side is outside the range defined as the frequency range in which the Josephson parametric oscillator 10 included in the oscillator group 15 on the output port 14 side is susceptible to influences.

According to the quantum device 1, it is possible to reduce the influence of crosstalk between the Josephson parametric oscillators 10 included in different oscillator groups 15.

Moreover, the upper limit value $f_{inf\_max}$ of the frequency range in which the Josephson parametric oscillator 10 is susceptible to influences is defined to be the oscillation frequency $f_{pump}/2$ of that Josephson parametric oscillator 10.

According to the quantum device 1, based on the knowledge that the upper limit value of the frequency range in which the Josephson parametric oscillator 10 is susceptible to influences is the oscillation frequency of the Josephson parametric oscillator 10, it is possible to reduce the influence of crosstalk between the Josephson parametric oscillators 10.

Also, the lower limit value $f_{inf\_min}$ of the frequency range in which the Josephson parametric oscillator 10 is susceptible to influences is defined as a frequency equal to or lower than the frequency calculated based on the oscillation frequency $f_{pump}/2$ of the Josephson parametric oscillator 10, the Kerr coefficient K, and the coherent state amplitude $\alpha$.

According to the quantum device 1, based on the knowledge that the lower limit value of the frequency range in which the Josephson parametric oscillator 10 is susceptible to influences depends on the oscillation frequency of that Josephson parametric oscillator 10, the Kerr coefficient, and the coherent state amplitude, it is possible to reduce the influence of crosstalk between the Josephson parametric oscillators 10.

The lower limit $f_{inf\_min}$ of the frequency range in which the Josephson parametric oscillator 10 is susceptible to influences may be defined as a frequency obtained by subtracting a value within the range of 20 megahertz to 800 megahertz from the oscillation frequency of the Josephson parametric oscillator 10. Furthermore, the lower limit $f_{inf\_min}$ of the frequency range in which the Josephson parametric oscillator 10 is susceptible to influences may be defined as a frequency obtained by subtracting 100 megahertz from the oscillation frequency of that Josephson parametric oscillator 10.

In the fifth example embodiment, the quantum device 3 according to the third example embodiment may be used in place of the quantum device 1 according to the first example embodiment.

In such a case also, the oscillation frequency of the Josephson parametric oscillator 10 can be set in the fifth example embodiment in the same way as that in the case of using the quantum device 1, and the same effects as those in the case of using the quantum device 1 can be achieved in the fifth example embodiment.

Sixth Example Embodiment

In a sixth example embodiment, an example of adjusting the oscillation frequency of the Josephson parametric oscillator 10 in the second example embodiment will be described.

A quantum device in the sixth example embodiment is similar to that in the second example embodiment, except that the oscillation frequency of the Josephson parametric oscillator is set based on specific conditions. The sixth example embodiment will also be described with reference to FIG. 1 to FIG. 4.

As in the case of the second example embodiment, the configuration of the quantum device 2 according to the sixth example embodiment may be considered as having a configuration in which one oscillator group 15 in the quantum device 1 includes only one pair of coupler 11 and Josephson parametric oscillator 10. Thus, in the sixth example embodiment, the oscillation frequency of the Josephson parametric oscillator 10 is set so that the condition (2) out of the conditions (1) and (2) described in the fifth example embodiment is satisfied. Regarding the condition (1), in the sixth example embodiment, since one oscillator group 15 includes only one Josephson parametric oscillator 10, the condition (1) can be considered to always hold.

Figure 8:
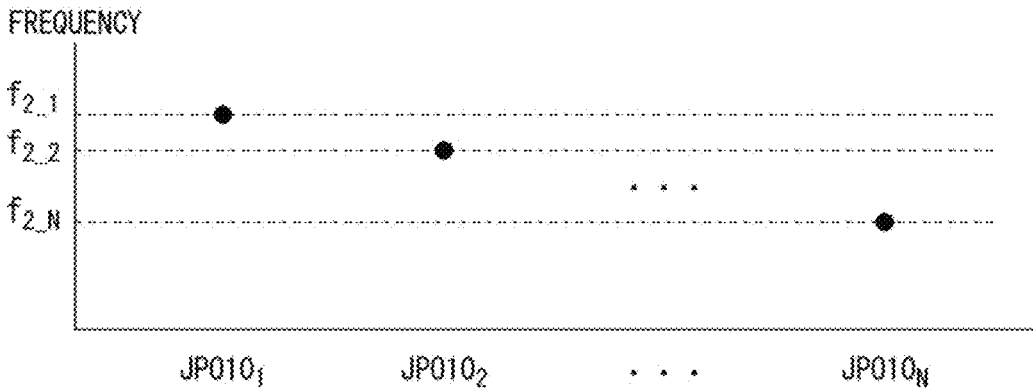
FIG. 8 is a diagram showing an example of oscillation frequencies of Josephson parametric oscillators in a quantum device according to a sixth example embodiment.

FIG. 8 is a diagram showing an example of oscillation frequencies of the Josephson parametric oscillator 10 in the quantum device 2. The vertical axis of the graph in FIG. 8 represents frequency, and the oscillator groups 15 are shown on the horizontal axis.

In FIG. 8, the oscillation frequency of the Josephson parametric oscillator $10_i$ is denoted as $f_{2\_i}$. As above, i is an integer where $1\leq i\leq N$, and N is an integer greater than or equal to 2 and indicates the number of oscillator groups 15.

In the example of FIG. 8, $f_{2\_1}\leq f_{2\_2}\leq \ldots \leq f_{2\_N}$.

Thus, in the example of FIG. 8, the oscillation frequency of the Josephson parametric oscillator 10 on the input port 13 side is greater (higher) than the oscillation frequency of the Josephson parametric oscillator 10 on the output port 14 side.

In the example of FIG. 8, the oscillation frequency of the Josephson parametric oscillator 10 on the input port 13 side is outside the frequency range in which the Josephson parametric oscillator 10 on the output port 14 side is susceptible to influences, which satisfies the above condition (2).

The Josephson parametric oscillator 10 on the input port 13 side can be regarded as a Josephson parametric oscillator 10 included in the oscillator group 15 on the input port 13 side. The Josephson parametric oscillator 10 on the output port 14 side can be regarded as a Josephson parametric oscillator 10 included in the oscillator group 15 on the output port 14 side.

In the sixth example embodiment, the same effects as those in the fifth example embodiment can be obtained also.

Moreover, in the sixth example embodiment, the oscillation frequency of the Josephson parametric oscillator 10 on the input port 13 side may be set higher than the oscillation frequency of the Josephson parametric oscillator 10 on the output port 14 side. In this regard, in the sixth example embodiment, determining the oscillation frequency of the Josephson parametric oscillator 10 is relatively straightforward.

In the sixth example embodiment, the quantum device 4 according to the fourth example embodiment may be used in place of the quantum device 2 according to the second example embodiment.

In such a case also, the oscillation frequency of the Josephson parametric oscillator 10 can be set in the sixth example embodiment in the same way as that in the case of using the quantum device 2, and the same effects as those in the case of using the quantum device 2 can be achieved in the sixth example embodiment.

Seventh Example Embodiment

In a seventh example embodiment, an example of the configuration of a quantum computing system including a quantum device and a control device that controls the quantum device will be described.

Figure 9:
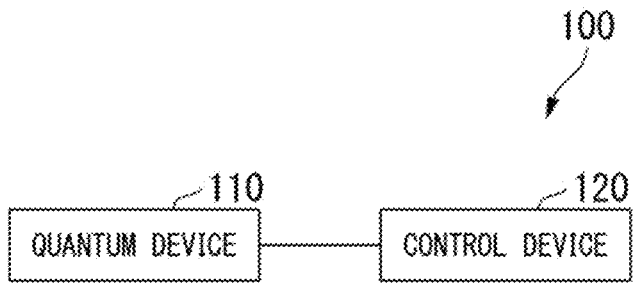
FIG. 9 is a diagram showing a configuration example of a quantum computing system according to a seventh example embodiment.

FIG. 9 is a diagram showing a configuration example of the quantum computing system according to the seventh example embodiment. In the configuration shown in FIG. 9, a quantum computing system 100 includes a quantum device 110 and a control device 120.

The quantum computing system 100 is a system that performs calculations using a quantum device.

The quantum device 110 is a quantum device in which the flow of signals between oscillators is limited to one-way flow using a circulator. As the oscillators of the quantum device 110, Josephson parametric oscillators may be used.

As the quantum device 110, any one of the quantum device 1, the quantum device 2, the quantum device 3, or the quantum device 4 may be used.

The control device 120 controls the quantum device 110 to perform calculations. In particular, the control device 120 controls the oscillators of the quantum device 110 by generating and sending control signals to the oscillators. The control device 120 may be configured, using a computer.

The control device 120 may control the oscillation frequency of the oscillators, as in the case of the fifth or sixth example embodiment.

EXPERIMENTAL EXAMPLE

An experiment was conducted to confirm that the configuration using circulators and an isolator reduces crosstalk on the input port side.

Figure 10:
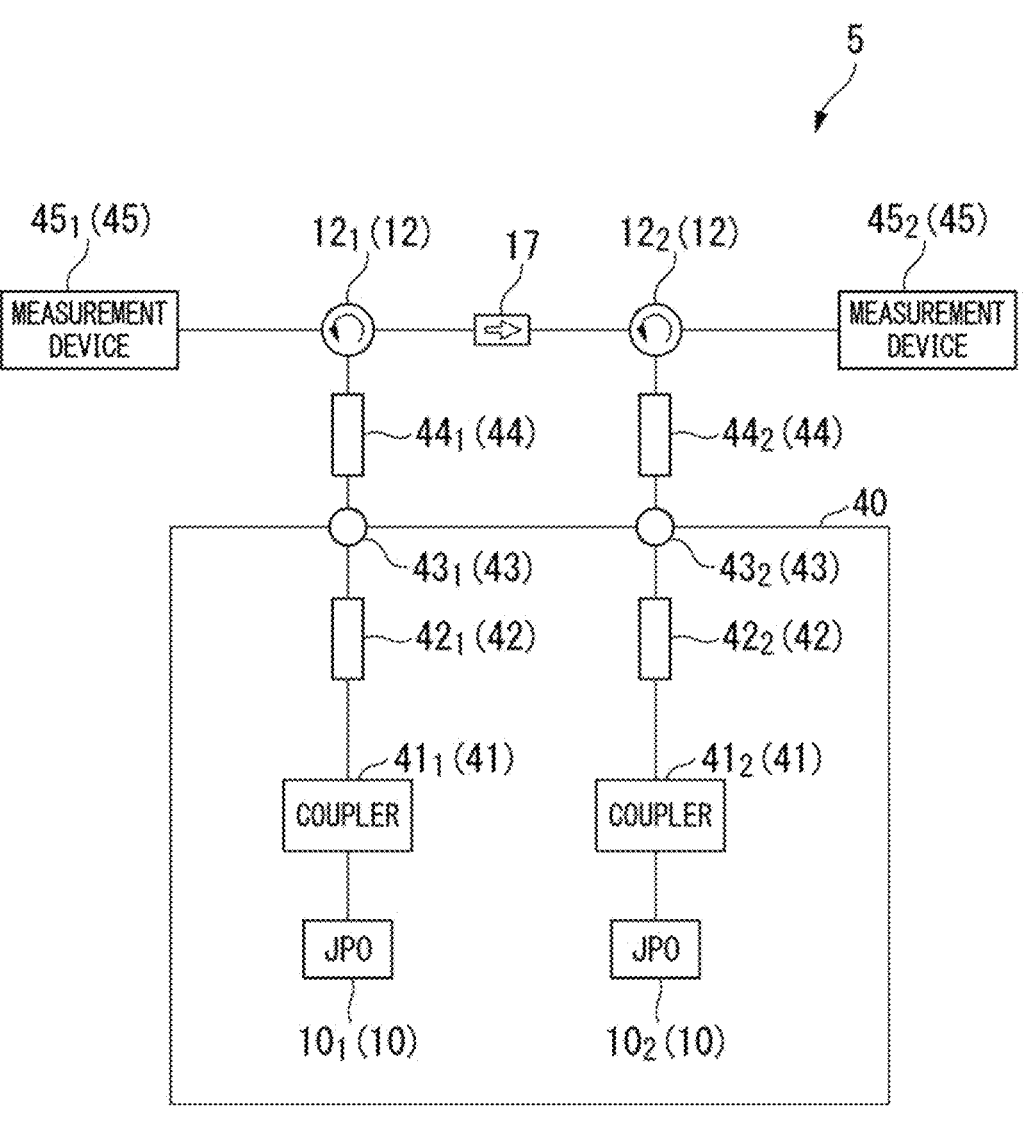
FIG. 10 is a diagram showing a configuration example of a quantum device used in an experiment.

FIG. 10 is a diagram showing a configuration example of a quantum device used in the experiment. In the configuration shown in FIG. 10, the quantum device 5 includes a quantum chip 40, two coaxial cables 44, two circulators 12, one isolator 17, and two measurement devices 45.

The quantum chip 40 has two Josephson parametric oscillators 10, two capacitive couplings 41, two transmission paths 42, and two signal ports 43.

The two Josephson parametric oscillators 10 are also referred to as a first Josephson parametric oscillator $10_1$ and a second Josephson parametric oscillator $10_2$, respectively. The two capacitive couplings 41 are also referred to as a first capacitive coupling $41_1$ and a second capacitive coupling $41_2$. The two transmission paths 42 are also referred to as a first transmission path $42_1$ and a second transmission path $42_2$. The two signal ports 43 are also referred to as a first signal port $43_1$ and a second signal port $43_2$.

The first Josephson parametric oscillator $10_1$ is connected to the first signal port $43_1$ via the first capacitive coupling $41_1$ and the first transmission path $42_1$. The second Josephson parametric oscillator $10_2$ is connected to the second signal port $43_2$ via the second capacitive coupling $41_2$ and the second transmission path $42_2$.

The two coaxial cables 44 are also referred to as a first coaxial cable $44_1$ and a second coaxial cable $44_2$, respectively. The two circulators 12 are also referred to as a first circulator $12_1$ and a second circulator $12_2$, respectively. The two measurement devices 45 are also referred to as a first measurement device $45_1$ and a second measurement device $45_2$.

The first signal port $43_1$ is connected to the first circulator $12_1$ via the first coaxial cable $44_1$. The second signal port $43_2$ is connected to the second circulator $12_2$ via the second coaxial cable $44_2$.

A port 1 of the first circulator $12_1$ is connected to the first measurement device $45_1$, a port 2 is connected to the first coaxial cable $44_1$, and a port 3 is connected to the isolator 17.

A port 1 of the second circulator $12_2$ is connected to the isolator 17, a port 2 is connected to the second coaxial cable $44_2$, and a port 3 is connected to the second measurement device $45_2$.

The isolator 17 is oriented so as to transmit a signal from the first circulator $12_1$ to the second circulator $12_2$ but to block signals from the second circulator $12_2$ to the first circulator $12_1$.

The quantum chip 40 is maintained at a low temperature using a dilution refrigerator.

In the quantum device 5, crosstalk between the two Josephson parametric oscillators 10 can be reduced. Specifically, the oscillation signal of the second Josephson parametric oscillator $10_2$ is suppressed from being transmitted to the first Josephson parametric oscillator $10_1$.

This makes it possible in the quantum device 5 to prevent or reduce a reduction in the readout fidelity of the first Josephson parametric oscillator $10_1$ caused by the incidence of the oscillation signal of the second Josephson parametric oscillator $10_2$.

Moreover, in the quantum device 5, crosstalk can be reduced without using an element that limits the pass-band, such as a band-pass filter, and in this respect, the frequency variability of the Josephson parametric oscillator 10 can be utilized.

In the experiment using the quantum device 5, the change in the readout fidelity of the first Josephson parametric oscillator $10_1$ was measured between instances where the second Josephson parametric oscillator $10_2$ outputs an oscillation signal and where it does not. Also, the change in the readout fidelity of the second Josephson parametric oscillator $10_2$ was measured between instances where the first Josephson parametric oscillator $10_1$ outputs an oscillation signal and where it does not. As an indicator of readout fidelity, the probability of correctly identifying the quantum bit state of the Josephson parametric oscillators 10 was used through measurement of oscillation signals.

The experiment yielded results indicating that the former scenario (the change in readout fidelity of the first Josephson parametric oscillator 10₁ between instances where the second Josephson parametric oscillator 10₂ outputs an oscillation signal and in the case where it does not) was smaller than the latter scenario (the change in readout fidelity of the second Josephson parametric oscillator 10₂ between instances where the first Josephson parametric oscillator 10₁ outputs an oscillation signal and where the first Josephson parametric oscillator 10₁ does not output an oscillation signal).

This experimental outcome suggests that it is possible to prevent or alleviate the decrease in the readout fidelity of the first Josephson parametric oscillator 10₁ caused by the incidence of oscillation signals from the second Josephson parametric oscillator 10₂.

Additionally, an experiment utilizing numerical simulations based on quantum mechanics was conducted to explore the correlation between the frequency of incident signals to the Josephson parametric oscillator and its influence on the Josephson parametric oscillator. The experiment examined the correlation between the frequency and power (intensity) of incident signals to the Josephson parametric oscillator and the readout fidelity of the Josephson parametric oscillator.

In the experiment, the Kerr coefficient was set to K=−12 megahertz and the coherent state amplitude was set to α=1.1.

Moreover, the simulator was configured with the detuning of the incident signals for the frequency setting. The detuning $\Delta$ of the incident signal is expressed as shown in Equation (3).

(Equation 3)

$$\Delta = f_{input} - \frac{f_{pump}}{2} \qquad (3)$$

$f_{input}$ denotes the frequency of the input signal, and $f_{pump}$ denotes the frequency of the pump signal input to the Josephson parametric oscillator.

Furthermore, the readout fidelity of the Josephson parametric oscillator was assessed by calculating the probability of correctly identifying the quantum bit state of the Josephson parametric oscillator 10 through measurement of its oscillation signal. Specifically, the probability was calculated by summing: the probability of the bit value indicated by the Josephson parametric oscillator being 0 and the probability of the bit value that can be read by measuring the state of the Josephson parametric oscillator being 0; and the probability of the bit value indicated by the Josephson parametric oscillator being 1 and the probability of the bit value that can be read by measuring the state of the Josephson parametric oscillator being 1.

Figure 11:
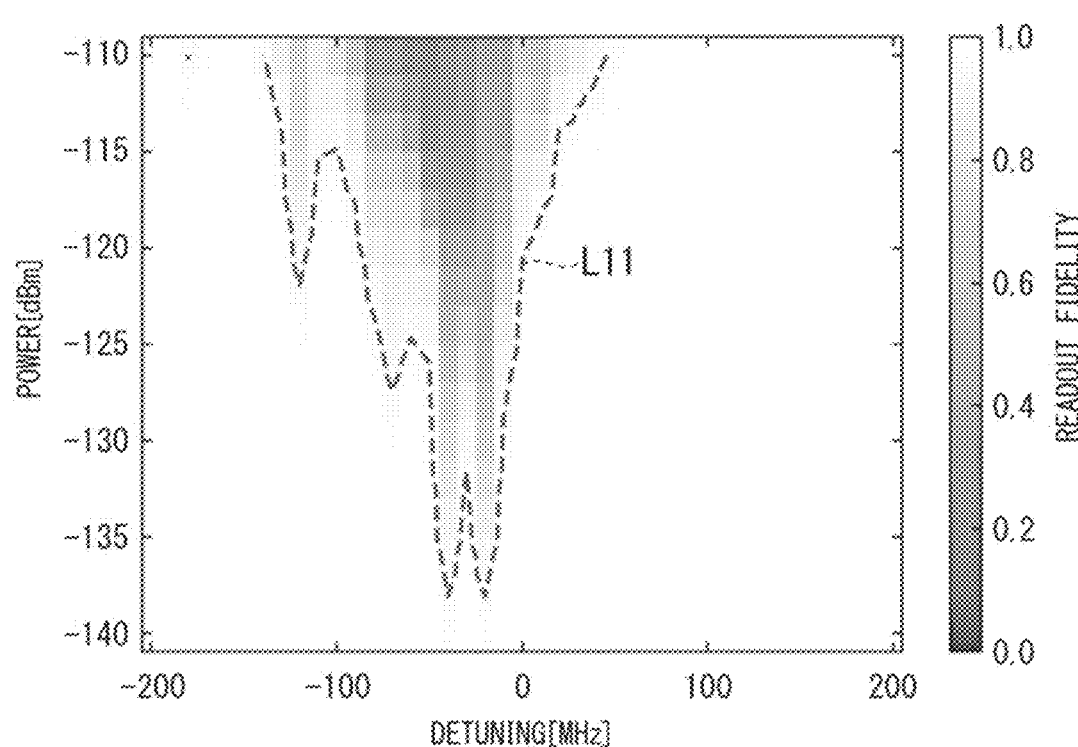
FIG. 11 is a diagram showing an example of the correlation between detuning and power of an incident signal to a Josephson parametric oscillator and readout fidelity of the Josephson parametric oscillator according to at least one of the example embodiments.

FIG. 11 is a diagram showing an example of the correlation between detuning and power of an incident signal to a Josephson parametric oscillator and readout fidelity of the Josephson parametric oscillator. FIG. 11 shows the correlation observed in the experiment.

The horizontal axis of FIG. 11 represents the detuning of the incident signal. The horizontal axis is measured in megahertz. The vertical axis represents the power of the incident signal. The vertical axis is measured in decibel milliwatts (dBm).

FIG. 11 also shows the readout fidelity of the Josephson parametric oscillator in gray scale. The brighter (whiter) portions of the graph indicate higher readout fidelity, while darker (blacker) portions indicate lower readout fidelity.

Line L11 represents a contour where the readout fidelity is 0.95.

For example, assuming the power of the oscillation signal of the Josephson parametric oscillator to be within the range from −130 decibel milliwatts to −120 decibel milliwatts, in the case where the detuning $\Delta$ was 0 or greater, the readout fidelity was generally always 95% or higher.

Additionally, assuming the power of the oscillation signal of the Josephson parametric oscillator to be within the range from −130 decibel milliwatts to −120 decibel milliwatts, in the case where the detuning $\Delta$ was −100 megahertz or lower, the readout fidelity was generally always 95% or higher. This suggests that the frequency range in which the Josephson parametric oscillator is susceptible to influences could be defined as the range from 100 megahertz below the oscillation frequency to the oscillation frequency itself.

Eighth Example Embodiment

Figure 12:
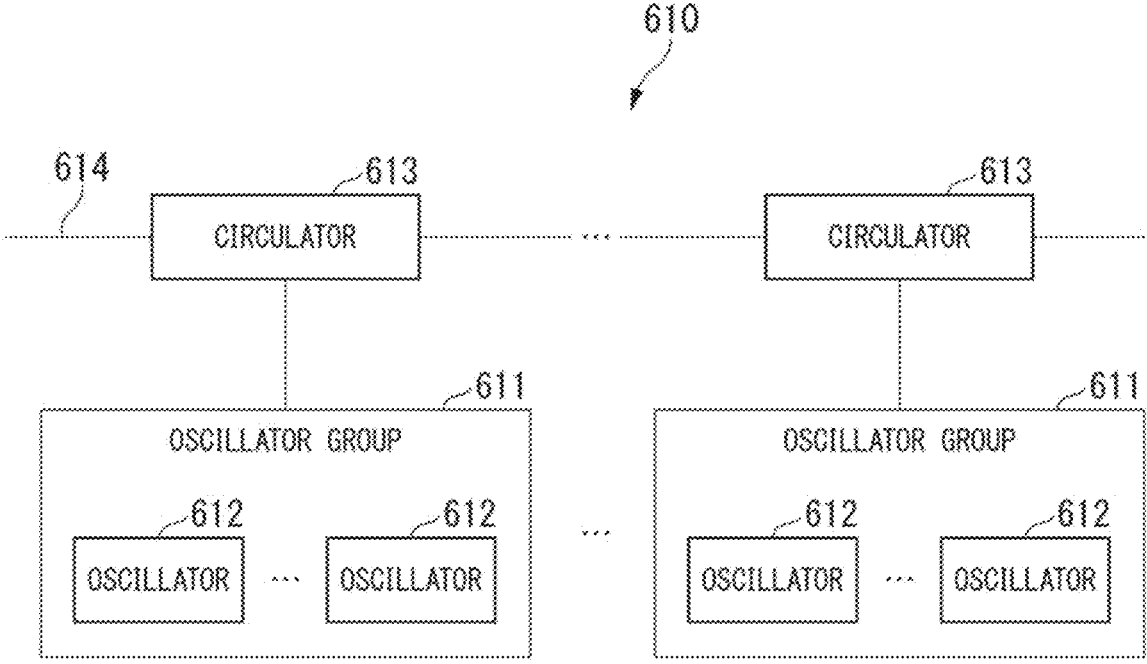
FIG. 12 is a diagram showing a configuration example of a quantum device according to an eighth example embodiment.

FIG. 12 is a diagram showing a configuration example of a quantum device according to an eighth example embodiment. In the configuration shown in FIG. 12, a quantum device 610 includes a plurality of oscillator groups 611, a plurality of circulators 613, and a transmission path 614 common to the plurality of circulators 613. Each of the plurality of oscillator groups 611 includes one or more oscillators having frequency variability.

One or more oscillators 612 included in one oscillator group 611 are connected to one port of one circulator 613 common to the one or more oscillators 612. Each of the plurality of circulators 613 is arranged on the transmission path 614 so as to transmit a signal from a first end side of the transmission path 614 to the oscillator group 611 side and transmit a signal from the oscillator group 611 side to a second end side of the transmission path 614, but to block signals from the second end side to the oscillator group 611 side and from the oscillator group 611 side to the first end side.

According to the quantum device 610, it is possible to reduce the influence of crosstalk between the oscillators 612. Specifically, the transmission of an oscillation signal from the oscillator 612 in a certain oscillator group 611 to another oscillator group 611 located closer to the first end than that oscillator group 611 is suppressed.

Moreover, in the quantum device 610, crosstalk can be reduced without using an element that limits the pass-band, such as a band-pass filter, and in this respect, the frequency variability of the oscillator 612 can be utilized.

Thus, according to the quantum device 610, it is possible to reduce crosstalk between oscillators 612 and utilize the frequency variability of the oscillators 612.

Ninth Example Embodiment

Figure 13:
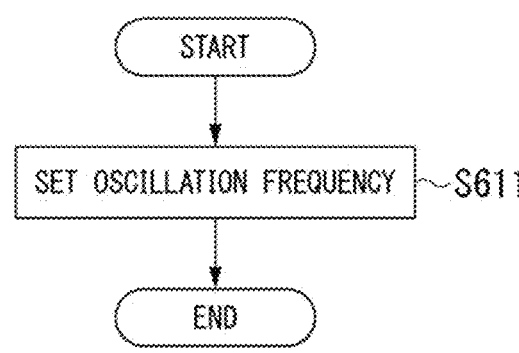
FIG. 13 is a diagram showing an example of a processing procedure in an oscillation frequency setting method according to a ninth example embodiment.

FIG. 13 is a diagram showing an example of a processing procedure in an oscillation frequency setting method according to a ninth example embodiment. The oscillation frequency setting method shown in FIG. 13 includes a step of setting the oscillation frequency (Step S611).

In the ninth example embodiment, a quantum device includes a plurality of oscillator groups, a plurality of circulators, and a transmission path common to the plurality of circulators. Each of the plurality of oscillator groups includes one or more oscillators having frequency variability. One or more oscillators included in one oscillator group are connected to one port of one circulator common to the one or more oscillators. Each of the plurality of circulators is arranged on the transmission path so as to transmit a signal from a first end side of the transmission path to the oscillator group side and transmit a signal from the oscillator group side to a second end side of the transmission path, but to block signals from the second end side to the oscillator group side and from the oscillator group side to the first end side.

In the step of setting the oscillation frequency (Step S611), a control device that controls the quantum device sets an oscillation frequency of each oscillator for any combination of two oscillators included in different oscillator groups, so that an oscillation frequency of the oscillator included in the oscillator group on the first end side of the two oscillators is outside a range defined as a frequency range in which the oscillator included in the oscillator group on the second end side is susceptible to influences.

According to the oscillation frequency setting method shown in FIG. 13, it is possible to reduce the influence of crosstalk between oscillators included in different oscillator groups.

Figure 14:
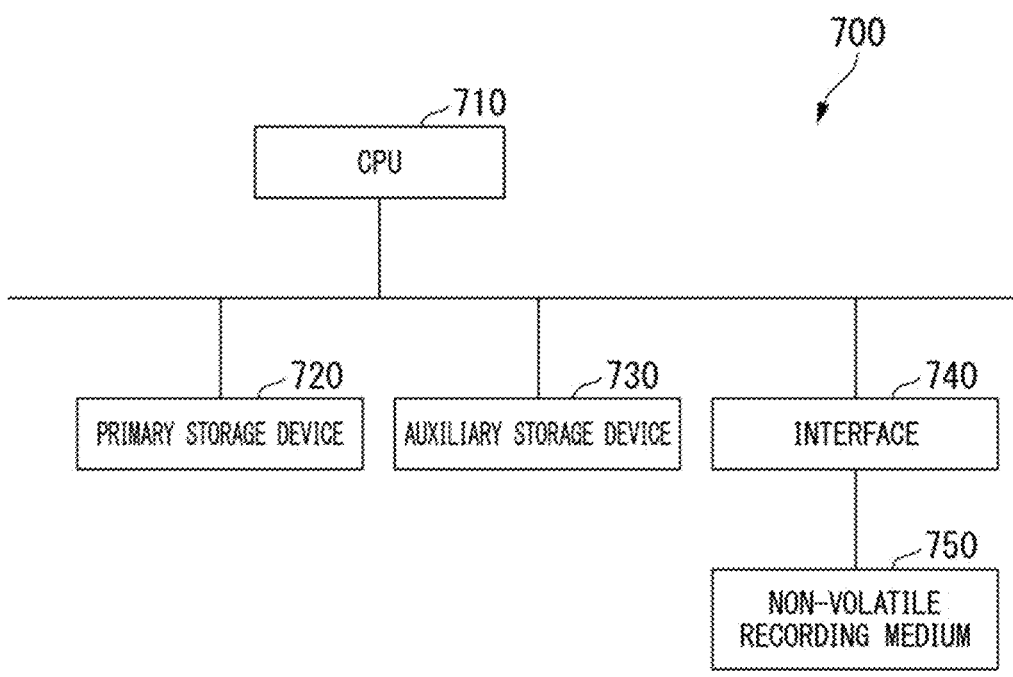
FIG. 14 is a schematic block diagram showing a configuration example of a computer according to at least one of the example embodiments.

FIG. 14 is a schematic block diagram showing a configuration example of a computer according to at least one of the example embodiments.

In the configuration shown in FIG. 14, a computer 700 includes a CPU (Central Processing Unit) 710, a primary storage device 720, an auxiliary storage device 730, an interface 740, and a non-volatile recording medium 750.

The above control device 120 or part thereof may be implemented in the computer 700. In such a case, the operation of the control device 120 is stored in the auxiliary storage device 730 in the form of a program. The CPU 710 reads out the program from the auxiliary storage device 730, loads it on the primary storage device 720, and executes the processes described above, according to the program.

Moreover, the CPU 710 secures a memory storage region in the primary storage device 720 for the processing to be performed by the control device 120, according to the program. Communication between the control device 120 and another device is executed by the interface 740 having a communication function and communicating according to the control of the CPU 710. Interaction between the control device 120 and a user is executed by the interface 740 having a display device and an input device, displaying various images under control of the CPU 710, and accepting user operations.

Any one or more of the programs described above may be recorded in the non-volatile recording medium 750. In such a case, the interface 740 may read the program from the non-volatile recording medium 750. Then, the CPU 710 directly executes the program read by the interface 740, or it may be temporarily stored in the primary storage device 720 or the auxiliary storage device 730 and then executed.

It should be noted that a program for executing all or part of the processes performed by the control unit 120 may be recorded on a computer-readable recording medium, and the program recorded on the recording medium may be read into and executed on a computer system, to thereby perform the processing of each unit. The "computer system" here includes an OS (operating system) and hardware such as peripheral devices.

Moreover, the "computer-readable recording medium" referred to here refers to a portable medium such as a flexible disk, a magnetic optical disk, a ROM (Read Only Memory), and a CD-ROM (Compact Disc Read Only Memory), or a storage device such as a hard disk built in a computer system. The above program may be a program for realizing a part of the functions described above, and may be a program capable of realizing the functions described above in combination with a program already recorded in a computer system.

The example embodiments of the present disclosure have been described in detail with reference to the drawings. However, the specific configuration of the disclosure is not limited to the example embodiments, and may include designs and so forth that do not depart from the scope of the present disclosure.

The whole or part of the example embodiments disclosed above can be described as, but not limited to, the following supplementary notes.

Supplementary Note 1

A quantum device comprising:
a plurality of oscillator groups;
a plurality of circulators; and
a transmission path common to the plurality of circulators,
wherein each of the plurality of oscillator groups includes one or more oscillators having frequency variability,
the one or more oscillators are connected to one port of one circulator of the plurality of circulators, the one circulator being common to the one or more oscillators, and
wherein each of the plurality of circulators is arranged on the transmission path,
wherein each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end.

Supplementary Note 2

The quantum device according to supplementary note 1, wherein an oscillation frequency of each oscillator included in all the oscillator groups is different from each other.

Supplementary Note 3

The quantum device according to supplementary note 1 or 2, further comprising
an isolator that is provided between at least a pair of circulators of the plurality of circulators, the at least a pair of circulators being adjacent to each other in the transmission path, and is configured to transmit a signal from the first end to the second end and block a signal from the second end so as not to transmit the signal to the first end side.

Supplementary Note 4

The quantum device according to any one of supplementary notes 1 to 3, wherein one of the plurality of circulators and one of the one or more oscillators are connected to each other.

Supplementary Note 5

The quantum device according to any one of supplementary notes 1 to 3, wherein at least one oscillator group of the oscillator groups includes a plurality of the oscillators including the one or more oscillators, and wherein an oscillation frequency of each oscillator in a same oscillator group of the at least one oscillator group is set so that, for any combination of two oscillators included in the same oscillator group, a difference in oscillation frequency between the two oscillators is greater than or equal to a width of a range defined as a frequency range in which the oscillator is susceptible to influences.

Supplementary Note 6

The quantum device according to any one of supplementary notes 1 to 5, wherein an oscillation frequency of each oscillator in different oscillator groups of the plurality of oscillator groups is set so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences.

Supplementary Note 7

The quantum device according to supplementary note 6, wherein an upper limit value of the frequency range in which the oscillator is susceptible to influences is determined to be an oscillation frequency of the oscillator.

Supplementary Note 8

The quantum device according to supplementary note 6 or 7, wherein a lower limit value of the frequency range in which the oscillator is susceptible to influences is determined to be a frequency calculated based on an oscillation frequency of the oscillator, a Kerr coefficient, and a coherent state amplitude.

Supplementary Note 9

The quantum device according to any one of supplementary notes 6 to 8, wherein the lower limit value of the frequency range in which the oscillator is susceptible to influences is determined to be a frequency obtained by subtracting a value within a range from 20 MHz to 800 MHz from the oscillation frequency of the oscillator.

Supplementary Note 10

The quantum device according to supplementary note 9, wherein the lower limit value of the frequency range in which the oscillator is susceptible to influences is determined to be a frequency obtained by subtracting 100 MHz from the oscillation frequency of the oscillator.

Supplementary Note 11

An oscillation frequency setting method executed by a control device that controls a quantum device, the quantum device comprising: a plurality of oscillator groups; a plurality of circulators; and a transmission path common to the plurality of circulators, wherein each of the plurality of oscillator groups includes one or more oscillators having frequency variability, the one or more oscillators are connected to one port of one circulator of the plurality of circulators, the one circulator being common to the one or more oscillators, wherein each of the plurality of circulators is arranged on the transmission path, wherein each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end, wherein at least one oscillator group of the oscillator groups includes a plurality of the oscillators including the one or more oscillators, the method comprising:

setting an oscillation frequency of each oscillator in a same oscillator group of the at least one oscillator group so that, for any combination of two oscillators included in the same oscillator group, a difference in oscillation frequency between the two oscillators is greater than or equal to a width of a range defined as a frequency range in which the oscillator is susceptible to influences.

Supplementary Note 12

An oscillation frequency setting method executed by a control device that controls a quantum device, the quantum device comprising: a plurality of oscillator groups; a plurality of circulators; and a transmission path common to the plurality of circulators, wherein each of the plurality of oscillator groups includes one or more oscillators having frequency variability, the one or more oscillators are connected to one port of one circulator of the plurality of circulators, the one circulator being common to the one or more oscillators, wherein each of the plurality of circulators is arranged on the transmission path, wherein each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end, the method comprising:

setting an oscillation frequency of each oscillator in different oscillator groups of the plurality of oscillator groups so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences.

Supplementary Note 13

A non-transitory computer-readable recording medium storing a program for a computer that controls a quantum device, the quantum device comprising: a plurality of oscillator groups; a plurality of circulators; and a transmission path common to the plurality of circulators, wherein each of the plurality of oscillator groups includes one or more oscillators having frequency variability, the one or more oscillators are connected to one port of one circulator of the plurality of circulators, the one circulator being common to the one or more oscillators, wherein each of the plurality of circulators is arranged on the transmission path, wherein each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end, wherein at least one oscillator group of the oscillator groups includes a plurality of the oscillators including the one or more oscillators, the program causing the computer to execute:

setting an oscillation frequency of each oscillator in a same oscillator group of the at least one oscillator group so that, for any combination of two oscillators included in the same oscillator group, a difference in oscillation frequency between the two oscillators is greater than or equal to a width of a range defined as a frequency range in which the oscillator is susceptible to influences.

Supplementary Note 14

A non-transitory computer-readable recording medium storing a program for a computer that controls a quantum device, the quantum device comprising: a plurality of oscillator groups; a plurality of circulators; and a transmission path common to the plurality of circulators, wherein each of the plurality of oscillator groups includes one or more oscillators having frequency variability, the one or more oscillators are connected to one port of one circulator of the plurality of circulators, the one circulator being common to the one or more oscillators, wherein each of the plurality of circulators is arranged on the transmission path, wherein each of the plurality of circulators is configured to: transmit a signal from a first end of the transmission path to the oscillator groups; transmit a signal from any of the oscillator groups to a second end of the transmission path; block a signal from the second end so as not to transmit the signal to the oscillator group; and block a signal from any of the oscillator groups so as not to transmit the signal to the first end, the method comprising:

setting an oscillation frequency of each oscillator in different oscillator groups of the plurality of oscillator groups so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences.

What is claimed is:

1. A quantum device comprising:
a plurality of oscillator groups;
a plurality of circulators;
a transmission path common to the plurality of circulators,
wherein each of the plurality of oscillator groups includes one or more oscillators having frequency variability,
wherein the one or more oscillators are connected to one port of one circulator of the plurality of circulators, the one circulator being common to the one or more oscillators, wherein each of the plurality of circulators is arranged on the transmission path,
wherein each of the plurality of circulators is configured to:
transmit a signal from a first end of the transmission path to the plurality of oscillator groups;
transmit a signal from any of the plurality of oscillator groups to a second end of the transmission path;
block a signal from the second end of the transmission path so as not to transmit the signal to the plurality of oscillator groups; and
block a signal from any of the plurality of oscillator groups so as not to transmit the signal to the first end of the transmission path; and
one or more couplers each having a first end and a second end,
wherein the one or more oscillators are respectively directly connected to the one or more couplers at the first end of the respective coupler,
wherein the second end of each of the one or more couplers is directly connected to the one port of the one circulator,
wherein the one or more couplers are a capacitive coupling or an inductive coupling,
wherein at least one oscillator group of the plurality of oscillator groups includes a plurality of oscillators including the one or more oscillators, and
wherein an oscillation frequency of each oscillator in a same oscillator group of the at least one oscillator group is set so that, for any combination of two oscillators included in the same oscillator group, a difference in oscillation frequency between the two oscillators is greater than or equal to a width of a range defined as a frequency range in which the oscillator is susceptible to influences.

2. The quantum device according to claim 1, wherein an oscillation frequency of each oscillator included in all of the plurality of oscillator groups is different from each other.

3. The quantum device according to claim 1, further comprising:
an isolator that is provided between at least a pair of circulators of the plurality of circulators, the at least the pair of circulators being adjacent to each other in the transmission path, and that is configured to transmit a signal from the first end of the transmission path to the second end of the transmission path and to block a signal from the second end of the transmission path so as not to transmit the signal to the first end side of the transmission path.

4. The quantum device according to claim 1, wherein one of the plurality of circulators and one of the one or more oscillators are connected to each other.

5. The quantum device according to claim 1, wherein an oscillation frequency of each oscillator in different oscillator groups of the plurality of oscillator groups is set so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences.

6. The quantum device according to claim 5, wherein an upper limit value of the frequency range in which the oscillator is susceptible to influences is determined to be an oscillation frequency of the oscillator.

7. The quantum device according to claim 5, wherein the lower limit value of the frequency range in which the oscillator is susceptible to influences is determined to be a frequency obtained by subtracting a value within a range from 20 MHz to 800 MHz from the oscillation frequency of the oscillator.

8. The quantum device according to claim 7, wherein the lower limit value of the frequency range in which the oscillator is susceptible to influences is determined to be a frequency obtained by subtracting 100 MHz from the oscillation frequency of the oscillator.

9. The quantum device according to claim 1, wherein the one or more oscillators are Josephson parametric oscillators.

10. A quantum device comprising:

a plurality of oscillator groups;

a plurality of circulators; and a transmission path common to the plurality of circulators, wherein each of the plurality of oscillator groups includes one or more oscillators having frequency variability, wherein the one or more oscillators are connected to one port of one circulator of the plurality of circulators, the one circulator being common to the one or more oscillators, wherein each of the plurality of circulators is arranged on the transmission path, wherein each of the plurality of circulators is configured to:

transmit a signal from a first end of the transmission path to the plurality of oscillator groups;

transmit a signal from any of the plurality of oscillator groups to a second end of the transmission path;

block a signal from the second end of the transmission path so as not to transmit the signal to the plurality of oscillator groups; and block a signal from any of the plurality of oscillator groups so as not to transmit the signal to the first end of the transmission path, wherein an oscillation frequency of each oscillator in different oscillator groups of the plurality of oscillator groups is set so that, for any combination of two oscillators included in the different oscillator groups, an oscillation frequency of the oscillator included in the oscillator group on a side of the first end of the two oscillators is outside a range defined as a frequency range in which the oscillator included in the oscillator group on the side of the second end is susceptible to influences, and wherein a lower limit value of the frequency range in which the oscillator is susceptible to influences is determined to be a frequency calculated based on an oscillation frequency of the oscillator, a Kerr coefficient, and a coherent state amplitude.

11. An oscillation frequency setting method executed by a control device that controls a quantum device, the quantum device comprising: a plurality of oscillator groups; a plurality of circulators; and a transmission path common to the plurality of circulators, wherein each of the plurality of oscillator groups includes one or more oscillators having frequency variability, wherein the one or more oscillators are connected to one port of one circulator of the plurality of circulators, the one circulator being common to the one or more oscillators, wherein each of the plurality of circulators is arranged on the transmission path, wherein each of the plurality of circulators is configured to: transmit a signal from a first end of the transmission path to the plurality of oscillator groups; transmit a signal from any of the plurality of oscillator groups to a second end of the transmission path; block a signal from the second end of the transmission path so as not to transmit the signal to the plurality of oscillator groups; and block a signal from any of the plurality of oscillator groups so as not to transmit the signal to the first end of the transmission path, wherein at least one oscillator group of the plurality of oscillator groups includes a plurality of the oscillators including the one or more oscillators, the method comprising:

setting an oscillation frequency of each oscillator in a same oscillator group of the at least one oscillator group so that, for any combination of two oscillators included in the same oscillator group, a difference in oscillation frequency between the two oscillators is greater than or equal to a width of a range defined as a frequency range in which the oscillator is susceptible to influences.

* * * * *